(12) United States Patent
Celia, Jr. et al.

(10) Patent No.: US 11,791,197 B2
(45) Date of Patent: Oct. 17, 2023

(54) DIE BONDING SYSTEM WITH WAFER LIFT AND LEVEL ASSEMBLY

(71) Applicant: MRSI Systems LLC, Tewksbury, MA (US)

(72) Inventors: Nicholas Samuel Celia, Jr., Avon, MA (US); Cyriac Devasia, Nashua, NH (US)

(73) Assignee: MRSI Systems LLC, Tewksbury, MA (US)

( * ) Notice: Subject to any disclaimer, the term of this patent is extended or adjusted under 35 U.S.C. 154(b) by 0 days.

(21) Appl. No.: 17/782,520

(22) PCT Filed: Aug. 20, 2021

(86) PCT No.: PCT/US2021/047004
§ 371 (c)(1),
(2) Date: Jun. 3, 2022

(87) PCT Pub. No.: WO2023/022736
PCT Pub. Date: Feb. 23, 2023

(65) Prior Publication Data
US 2023/0148356 A1    May 11, 2023

(51) Int. Cl.
*H01L 21/687* (2006.01)

(52) U.S. Cl.
CPC ...... *H01L 21/68785* (2013.01); *H01L 21/687* (2013.01); *H01L 21/68742* (2013.01)

(58) Field of Classification Search
CPC .............. H01L 21/687; H01L 21/68785
See application file for complete search history.

(56) References Cited

U.S. PATENT DOCUMENTS

| | | | |
|---|---|---|---|
| 6,346,038 B1* | 2/2002 | Kajiwara | B24B 37/345 451/41 |
| 2004/0177917 A1* | 9/2004 | Adachi | H01L 21/67742 156/538 |
| 2011/0232075 A1* | 9/2011 | Yamauchi | G03F 7/70816 269/21 |
| 2014/0113458 A1 | 4/2014 | Pan | |
| 2015/0090694 A1 | 4/2015 | Hashimoto | |
| 2018/0114714 A1* | 4/2018 | Kim | H01L 21/67063 |
| 2018/0251893 A1 | 9/2018 | Hohn | |

(Continued)

FOREIGN PATENT DOCUMENTS

| KR | 1020210009852 A | 1/2021 |
|---|---|---|
| KR | 1020210029413 A | 3/2021 |

OTHER PUBLICATIONS

International Search Report and Written Opinion for PCT Appl. No. PCT/US2021/047004 dated May 18, 2022, 10 pages.

*Primary Examiner* — Philip C Tucker
*Assistant Examiner* — John Blades
(74) *Attorney, Agent, or Firm* — Maine Cernota & Rardin

(57) ABSTRACT

A die bonding system comprising a wafer lift and level assembly configured to allow rapid planarization of a wafer comprising a wafer frame configured to retain a wafer and be slidably retained within guide clevises and a leveling pedestal configured to support a wafer from below in a localized area where a die bonding operation is to take place, allowing the quick and repeatable planarization of die(s) to the wafer without the need for distinct planarization procedures that would slow cycle times and decrease production.

17 Claims, 10 Drawing Sheets

(56) References Cited

U.S. PATENT DOCUMENTS

2019/0030550 A1    1/2019  Lee
2020/0035540 A1*   1/2020  Bhat ..................... H01L 21/68
2022/0316066 A1*  10/2022  Santiago ........... H01L 21/68785

* cited by examiner

DIE BONDING SYSTEM WITH WAFER LIFT AND LEVEL ASSEMBLY

RELATED APPLICATIONS

This application is a national phase application filed under 35 USC § 371 of PCT Application No. PCT/US2021/047004 with an International filing date of Aug. 20, 2021. This application is herein incorporated by reference, in its entirety, for all purposes.

FIELD OF THE DISCLOSURE

The disclosure relates to die bonding systems, and more particularly, to a die bonding system having a wafer lift and level assembly.

BACKGROUND OF THE DISCLOSURE

Typical die bonding applications involve placing dies on substrate. This may be done with the substrate at ambient temperature (e.g. where an epoxy is used) or at an elevated temperature, with heated substrates typically being heated from below to reflow temperatures while the bond head holds the die on top of the substrate (e.g. where pre-deposited solder is used or where the die is laid on top of a solder pre-form).

When reflowing multiple dies on the same substrate, it is desirable to have the bond head heat the die, as opposed to the substrate, to reflow temperatures, so as to not impact any previously-attached neighboring die(s).

In other cases, such as when heating the substrate from below using focused energy sources (e.g. a laser), it is desirable to have the die heated to minimize the laser energy needed to reflow, thereby reducing thermal shock to the die and substrate. Furthermore, focused energy sources, if relied upon to provide too much heat, can cause cracking of the substrate, thereby ruining it.

Additionally, current state of the art die bond systems utilize various techniques to ensure the planarity of dies to a wafer to which they will be bonded prior to beginning the bonding operation, however, such techniques are often relatively slow, put the die and/or substrate at risk of damage, or must be done prior to each die bonding operation on a single wafer. For instance, 3d surface mapping using lasers to ensure the die is planar to the wafer, while accurate, must be done prior to each bonding operation. A gimballing head, which self-planarizes the die to the wafer, ensuring alignment, despite being reasonably fast and effective, can cause scrubbing of the substrate during alignment, resulting in a lower yield.

Even still further, for high precision die bonding systems to quantify and, ultimately, reduce final placement error, an error budget is typically created. This error budget is generally broken into various categories, such as motion error in the gantry, imaging error, system calibration error, error introduced during picking of the die, and error introduced while placing a die on the substrate. These errors can be minimized using well-established methods, such as a high-performance gantry system, high-quality imaging optics and illumination, and keeping the system in a temperature-stable environment to maintain system calibration. However, even using state of the art equipment and techniques, when pick and place systems pick up small devices, which are generally presented in trays or picked directly from a diced wafer, a 'pick' error is inevitably introduced.

One way to minimize pick error is to use a stationary up-facing camera that is located in the gantry work area, but mounted on the machine deck at a specific location. The stationary camera images die fiducials, which are positioned on the bottom of the die, and calculates the 'pick' error. The pick error is then accounted for by the gantry system when the die is placed on its final location. While this is generally effective, it is not without its challenges and limitations.

The location of the stationary up-facing camera mounted on the machine deck has to be calibrated precisely for high precision bonding. However, any changes in the ambient temperature or that of the gantry, which is typically due to heat generated by its motors, affects the calibration of the up-facing camera and is sometimes referred to as drift.

One way to account for the up-facing camera 'drift' due to thermals is to force a calibration step every 'x' seconds or minutes. This, however, is time-consuming and adds to the machine cycle time.

There is thus a need for a die bonding system with the ability to heat up and cool down localized areas of a wafer quickly, while maintaining the precision required to handle dies smaller than 200 um$^2$, and that minimizes pick error and the possibility of wafer cracking while quickly and effectively ensuring the planarity of die(s) to a wafer, preferably one that only requires one planarization procedure per wafer.

SUMMARY OF THE DISCLOSURE

Disclosed herein is a die bonding system comprising a wafer lift and level assembly that uses suction cups in combination with a leveling pedestal and guide clevises to ensure planarity of the wafer to a die to be bonded thereto.

The die bonding system, in embodiments, further comprises a leveling pedestal that is configured to level a wafer and to provide localized heating.

One embodiment of the present disclosure provides a wafer lift and level assembly comprising: a wafer frame; at least three guide clevises; a levelling pedestal comprising levelling pedestal wafer retainers disposed in a top portion of the levelling pedestal, wherein the wafer frame comprises tabs configured to be slidably retained in the guide clevises, allowing for vertical movement of the wafer frame therein, and wafer retainers configured to securely hold a wafer thereto, wherein the levelling pedestal and guide clevises are configured for vertical motion relative to one another, allowing a wafer disposed in the wafer frame to be brought into contact with the levelling pedestal wafer retainers disposed in the top portion of the levelling pedestal, and wherein the levelling pedestal wafer retainers are configured to allow a wafer to be secured to the levelling pedestal.

Another embodiment of the present disclosure provides such a wafer lift and level assembly wherein the guide clevises comprise an open top portion, allowing the wafer frame to be inserted therein.

A further embodiment of the present disclosure provides such a wafer lift and level assembly wherein each of the guide clevises comprises at least one dashpot configured to be disposed between a tab of the wafer frame and the guide clevis.

Yet another embodiment of the present disclosure provides such a wafer lift and level assembly wherein the dashpots are pneumatic dashpots.

A yet further embodiment of the present disclosure provides such a wafer lift and level assembly wherein the wafer retainers are suction cups.

Still another embodiment of the present disclosure provides such a wafer lift and level assembly wherein the wafer retainers are vacuum ports in communication with a vacuum source.

A still further embodiment of the present disclosure provides such a wafer lift and level assembly wherein the levelling pedestal further comprises a heater assembly.

Even another embodiment of the present disclosure provides such a wafer lift and level assembly wherein the heater assembly further comprises an aperture.

An even further embodiment of the present disclosure provides such a wafer lift and level assembly further comprising a focused energy source configured to heat a wafer held by the wafer frame when disposed in the guide clevises through the aperture disposed in the heater assembly.

A still even another embodiment of the present disclosure provides such a wafer lift and level assembly wherein the focused energy source is a laser.

A still even further embodiment of the present disclosure provides such a wafer lift and level assembly wherein the heater assembly is configured to be controllably raised and lowered within the levelling pedestal, thereby bringing it into and out of contact with a wafer disposed on the levelling pedestal.

One embodiment of the present disclosure provides a method of planarizing a wafer, the method comprising: providing a wafer lift and level assembly comprising: a wafer frame; at least three guide clevises; a levelling pedestal comprising levelling pedestal wafer retainers disposed in a top portion of the levelling pedestal, wherein the wafer frame comprises tabs configured to be slidably retained in the guide clevises, allowing for vertical movement of the wafer frame therein, and wafer retainers configured to securely hold a wafer thereto, wherein the levelling pedestal and guide clevises are configured for vertical motion relative to one another, allowing a wafer disposed in the wafer frame to be brought into contact with the levelling pedestal wafer retainers disposed in the top portion of the levelling pedestal, and wherein the levelling pedestal wafer retainers are configured to allow a wafer to be secured to the levelling pedestal attaching a wafer to the wafer frame; disposing the wafer frame tabs in the guide clevises; and raising the levelling pedestal until a bottom portion of the wafer frame tabs ceases to contact a bottom portion of the guide clevises.

Another embodiment of the present disclosure provides such a method of planarizing a wafer wherein the levelling pedestal further comprises levelling pedestal wafer retainers, the method further comprising activating the levelling pedestal wafer retainers once the levelling pedestal contacts the wafer.

A further embodiment of the present disclosure provides such a method of planarizing a wafer wherein the levelling pedestal further comprises a heater, the method further comprising activating the heater during die bonding operations.

Yet another embodiment of the present disclosure provides such a method of planarizing a wafer wherein the heater slidably disposed within the levelling pedestal, the method further comprising raising and lowering the heater during die bonding operations.

A yet further embodiment of the present disclosure provides such a method of planarizing a wafer wherein the heater further comprises a central aperture and the levelling pedestal further comprises a focused energy source aimed through the central aperture, the method further comprising activating the focused energy source during a die bonding operation.

One embodiment of the present disclosure provides a wafer lift and level assembly comprising: a wafer frame; at least three guide clevises; a levelling pedestal comprising levelling pedestal wafer retainers disposed in a top portion of the levelling pedestal, wherein the wafer frame comprises tabs configured to be slidably retained in the guide clevises, allowing for vertical movement of the wafer frame therein, and wafer retainers configured to securely hold a wafer thereto, wherein the levelling pedestal and guide clevises are configured for vertical motion relative to one another, allowing a wafer disposed in the wafer frame to be brought into contact with the levelling pedestal wafer retainers disposed in the top portion of the levelling pedestal, wherein the levelling pedestal wafer retainers are configured to allow a wafer to be secured to the levelling pedestal, wherein the guide clevises comprise an open top portion, allowing the wafer frame to be inserted therein, wherein each of the guide clevises comprises at least one dashpot configured to be disposed between a tab of the wafer frame and the guide clevis, wherein the wafer retainers are vacuum ports in communication with a vacuum source, wherein the levelling pedestal further comprises a heater assembly comprising an aperture and the levelling pedestal further comprises a focused energy source configured to heat a wafer held by the wafer frame when disposed in the guide clevises through the aperture disposed in the heater assembly, and wherein the heater assembly is configured to be controllably raised and lowered within the levelling pedestal, thereby bringing it into and out of contact with a wafer disposed on the levelling pedestal.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present disclosure provides a die bonding system with wafer lift and level assembly. More specifically, through the use of a wafer frame 100 configured to retain a wafer 300 and be slidably retained within guide clevises 102 and a leveling pedestal 104 configured to support a wafer 300 from below in a localized area where a die bonding operation is to take place, the planarization of die(s) to the wafer 300 can be quickly and repeatably accomplished without the need for distinct planarization procedures that would slow cycle times and decrease production. While it is possible that a wafer 300 supported by the levelling pedestal 104 in this way may distort outside of the area supported by the levelling pedestal 104, since any bonding operation on the wafer 300 is intended to take place within the area supported by the levelling pedestal 104, this distortion is irrelevant. Furthermore, by providing highly localized support from the underside of a wafer 300, the levelling pedestal 104 tends to reduce instances of wafer cracking.

Figure 1:
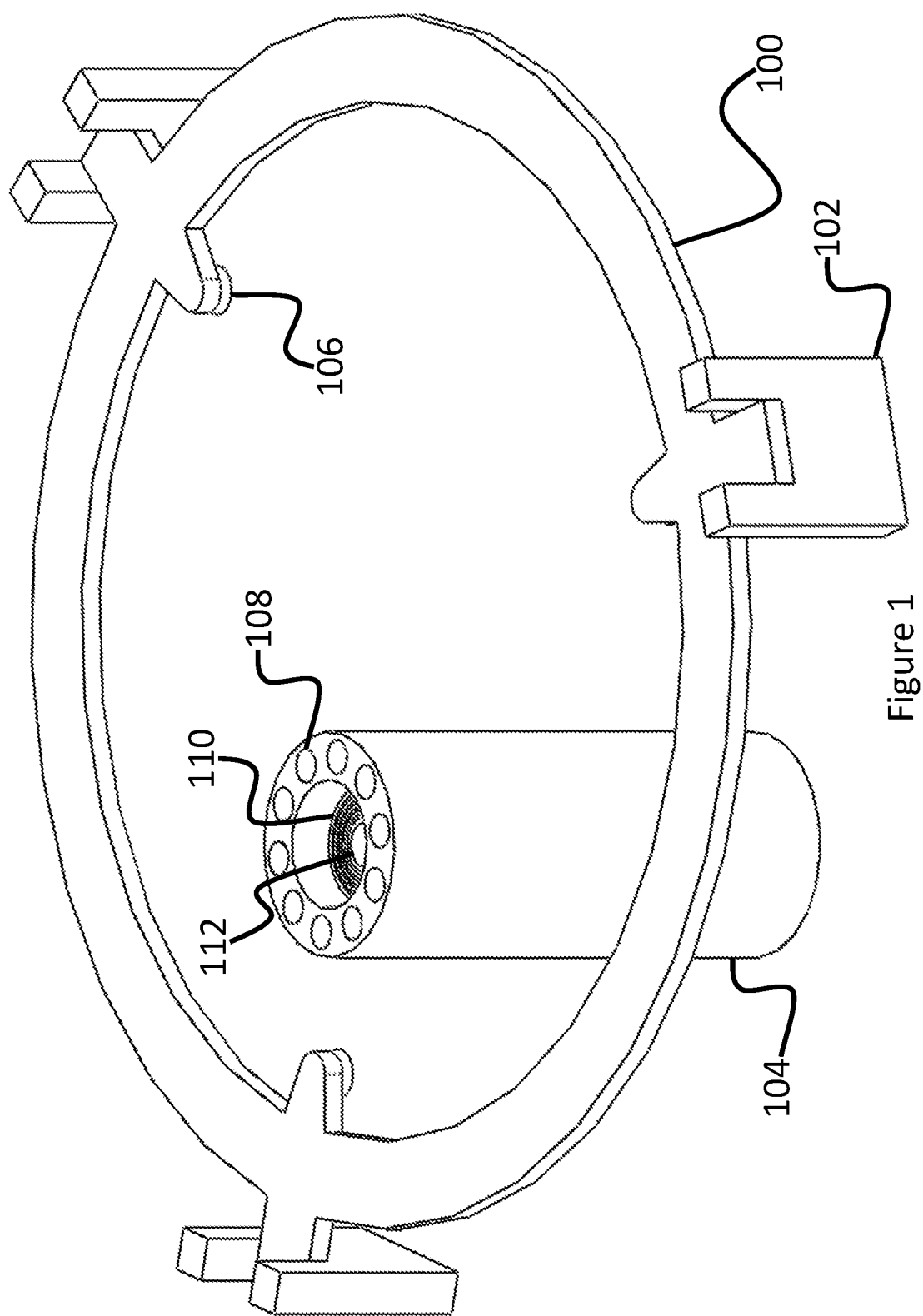
FIG. 1 is an isometric view of a wafer lift and level assembly wherein a leveling pedestal heater is depicted in a down position, in accordance with embodiments of the present disclosure.
Figure 2:
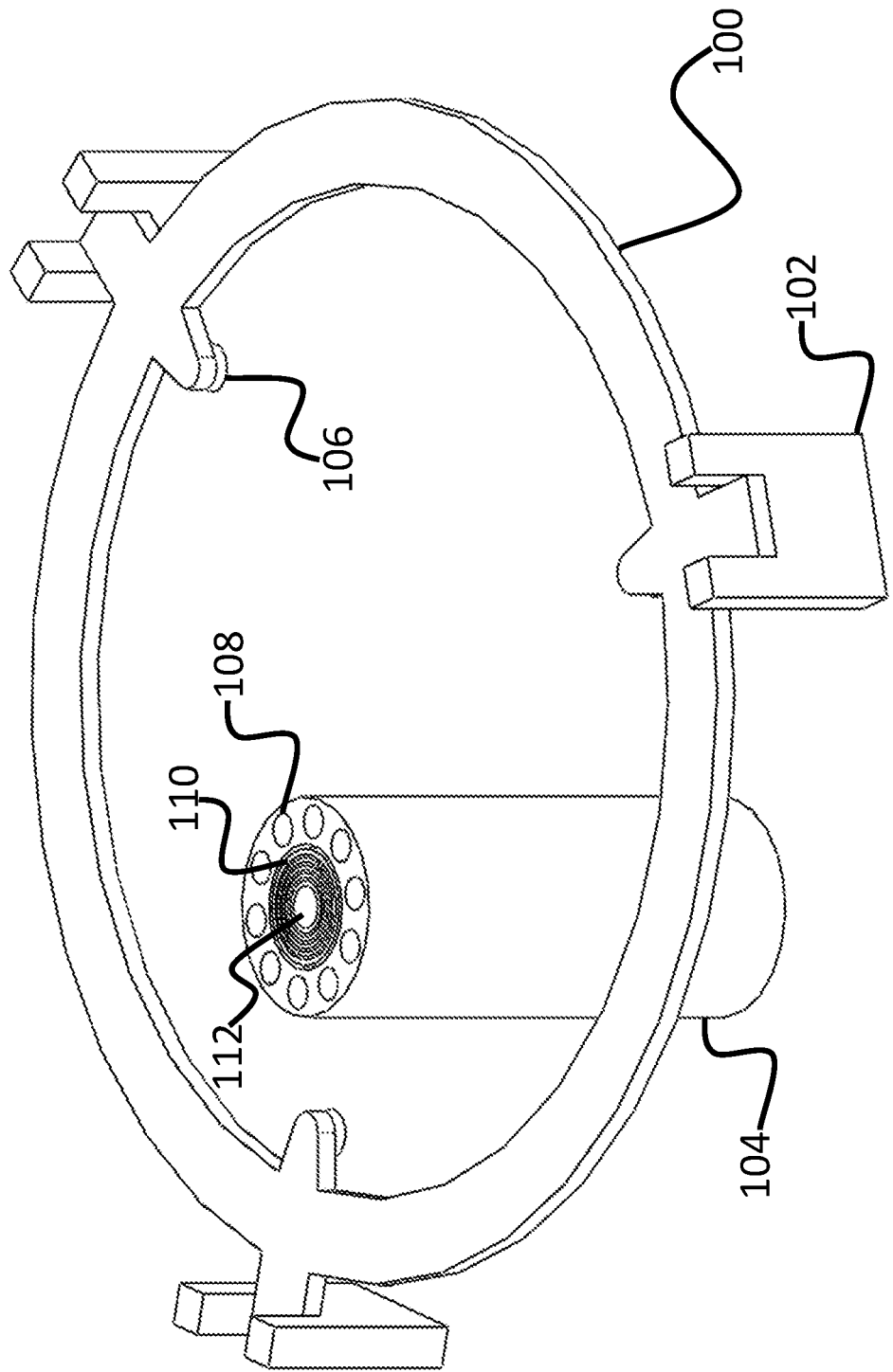
FIG. 2 is an isometric view of a wafer lift and level assembly wherein a leveling pedestal heater is depicted in a up position, in accordance with embodiments of the present disclosure.

Now referring to FIGS. 1 and 2, an embodiment of the present disclosure is provided. More specifically, FIGS. 1 and 2 show a wafer frame 100 comprising wafer retainers 106, in embodiments suction cups 106, configured to securely hold a wafer 300. The wafer frame 100 is slidably and removably disposed in guide clevises 102 that allow limited vertical movement of the wafer frame 100 while preventing the wafer frame 100 from rotating. FIG. 1 also shows a levelling pedestal 104 that, in embodiments, is capable of at least vertical movement relative to the guide clevises 102 and wafer frame 100, such that it can be placed into or out of contact with a wafer 300 retained by the wafer frame 100. The levelling pedestal 104 is configured such that it can lift the wafer 300 and wafer frame 100 off of a base portion of the guide clevises 102, allowing the wafer frame 100 to float within the guide clevises 102, thereby planarizing a wafer 300 held by the wafer frame 102 to the levelling pedestal 104.

The wafer frame 100, in embodiments, is configured to be set into the guide clevises 102 from a topside thereof, with the guide clevises 102 having an open top portion to allow for the wafer frame 100 to be inserted therein. In embodiments, this is a manual operation performed by a user while, in other embodiments, this is handled in an automated manner, such as by a robotic arm or other system, as would be known to one of ordinary skill in the art.

In embodiments, the wafer frame 100 comprises three wafer retainers and features for slidable and removable insertion into three guide clevises 102, however, other numbers of these features could be used, as would be apparent to one of ordinary skill in the art.

The levelling pedestal 104, in embodiments, comprises a planar top portion that is configured to rest against a bottom portion of a wafer 300 during use.

The levelling pedestal may further comprise a central cavity that contains a heater 110, which can be used to apply heat to a wafer 300. In embodiments, the heater 110 is configured to be raised and lowered within the central cavity. For instance, FIG. 1 shows the heater 110 in a lowered position while FIG. 2 shows the heater 110 in a raised position. In embodiments, the heater 110 is configured to provide a pre-heat to a wafer 300 to prepare it for a bonding operation.

In still further embodiments, the heater 110 comprises a central aperture 112 configured to allow a focused energy source, such as a laser, to apply heat to a bottom portion of a wafer 300.

In even still further embodiments, the levelling pedestal 104 comprises levelling pedestal wafer retainers 108, in embodiments vacuum ports 108 and in other embodiments suction cups 108, disposed about its periphery, which allow the levelling pedestal 104 to forcefully secure a wafer 300 thereto, ensuring the planarization of a wafer 300 to the levelling pedestal 104. While, in embodiments, such as the one depicted in FIG. 1, the levelling pedestal 104 is depicted with a circular cross section, other cross sections, such as a square cross section, could also be used.

In yet other embodiments, the levelling pedestal 104 functions both to planarize a wafer 300 as well as to manipulate it such that a near field camera is able to focus on it.

In an exemplary die bonding operation, a wafer 300 is first attached to the wafer frame 100, which is then disposed in the guide clevises 102. The levelling pedestal 104 is then raised such that it lifts the wafer frame 100 off of the guide clevises 102 and suction is applied to the wafer 300 via the levelling pedestal wafer retainers 108, securing the wafer 300 to the levelling pedestal 104. At this point, the heater 110 provides a pre-heat to an area of the wafer 300 in preparation for a bonding operation, which allows the wafer to flow material easily and helps to prevent cracking issues. Next, a gantry or similar apparatus places a die on the wafer 300 for bonding. Finally, a focused energy source, such as a laser, is enabled and provides energy through the central aperture 112 to the wafer 300, thereby heating it sufficiently to complete a die bonding operation.

In some embodiments, the heater 110 is always enabled while, in other embodiments it is ramped. In still other embodiments, the heater 110 is also configured to provide cooling, which can increase cycle times. In yet other embodiments, the heater 110 is configured to be slidably disposed within the levelling pedestal 104, allowing it to remain on while limiting heat applied to a wafer 300 disposed on the levelling pedestal 104 by being moved downwards.

In embodiments, the die bonding system further comprises a gantry-mounted heater configured to apply heat to a die from above the wafer 300.

Figure 3:
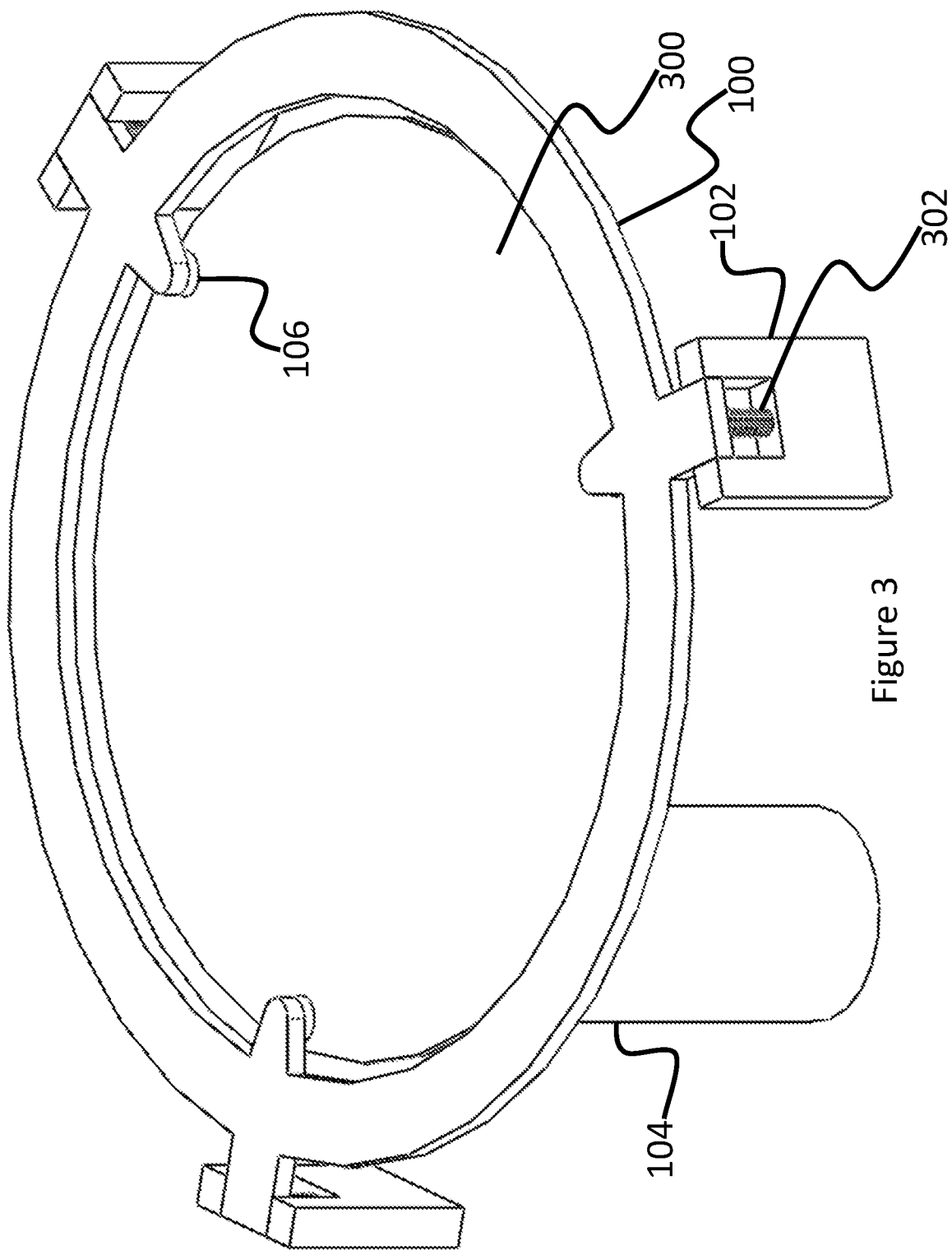
FIG. 3 is an isometric view of a wafer lift and level assembly holding a wafer, in accordance with embodiments of the present disclosure.

Now referring to FIG. 3, an embodiment of the present disclosure showing a wafer 300 disposed in the wafer frame 102 is provided. FIG. 3 also depicts dashpots 302 disposed within the guide clevises 102, such that they support the wafer frame 100, allowing the levelling pedestal 104 to work more closely to the edge of the wafer 300 than would otherwise be possible by acting as a counterbalance. In embodiments, the dashpots 302 are pneumatic dashpots. In still further embodiments, the dashpots 302 can be controllably raised and lowered, such as by a control module.

Figure 4:
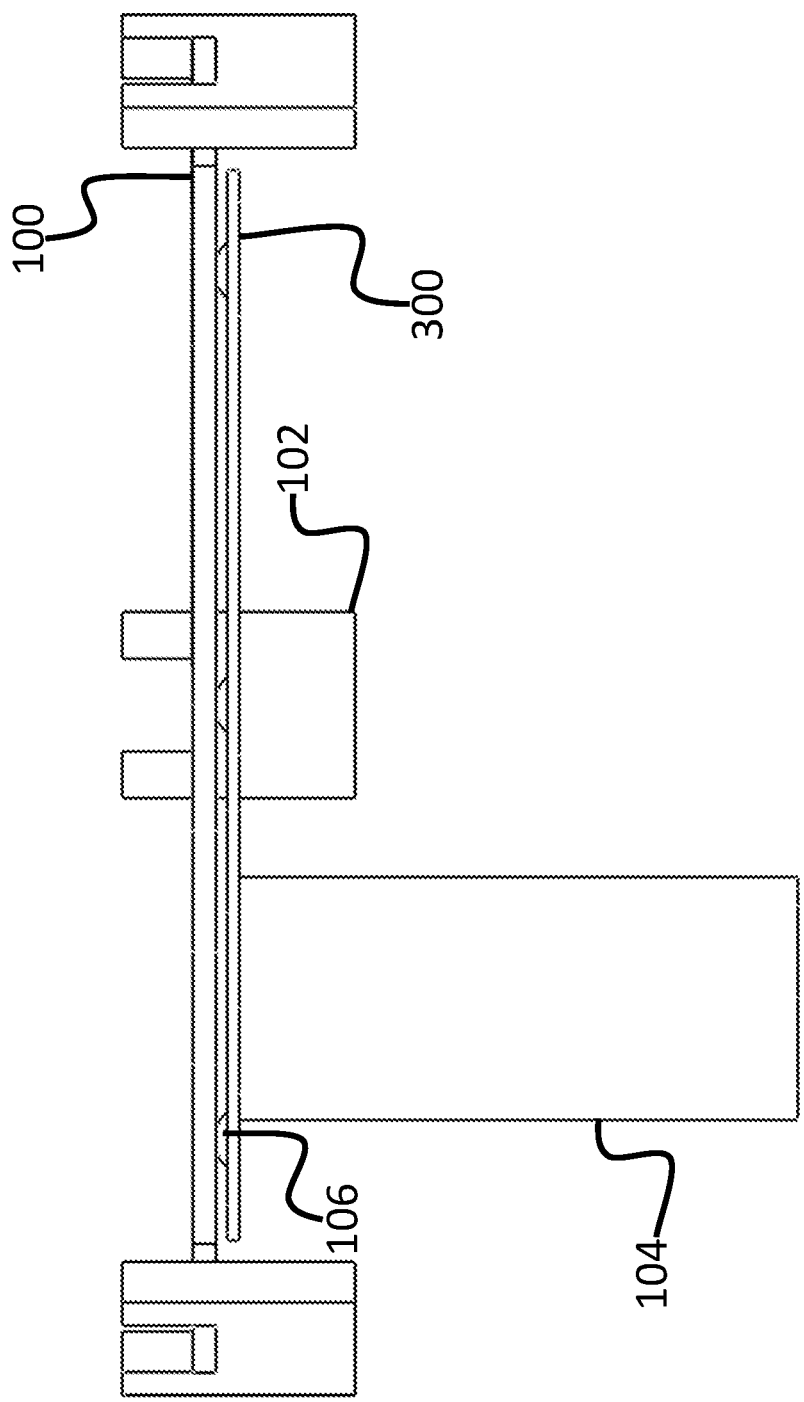
FIG. 4 is a side elevation view of a wafer lift and level assembly depicting a wafer attached to both a wafer frame and a levelling pedestal, in accordance with embodiments of the present disclosure.
Figure 5:
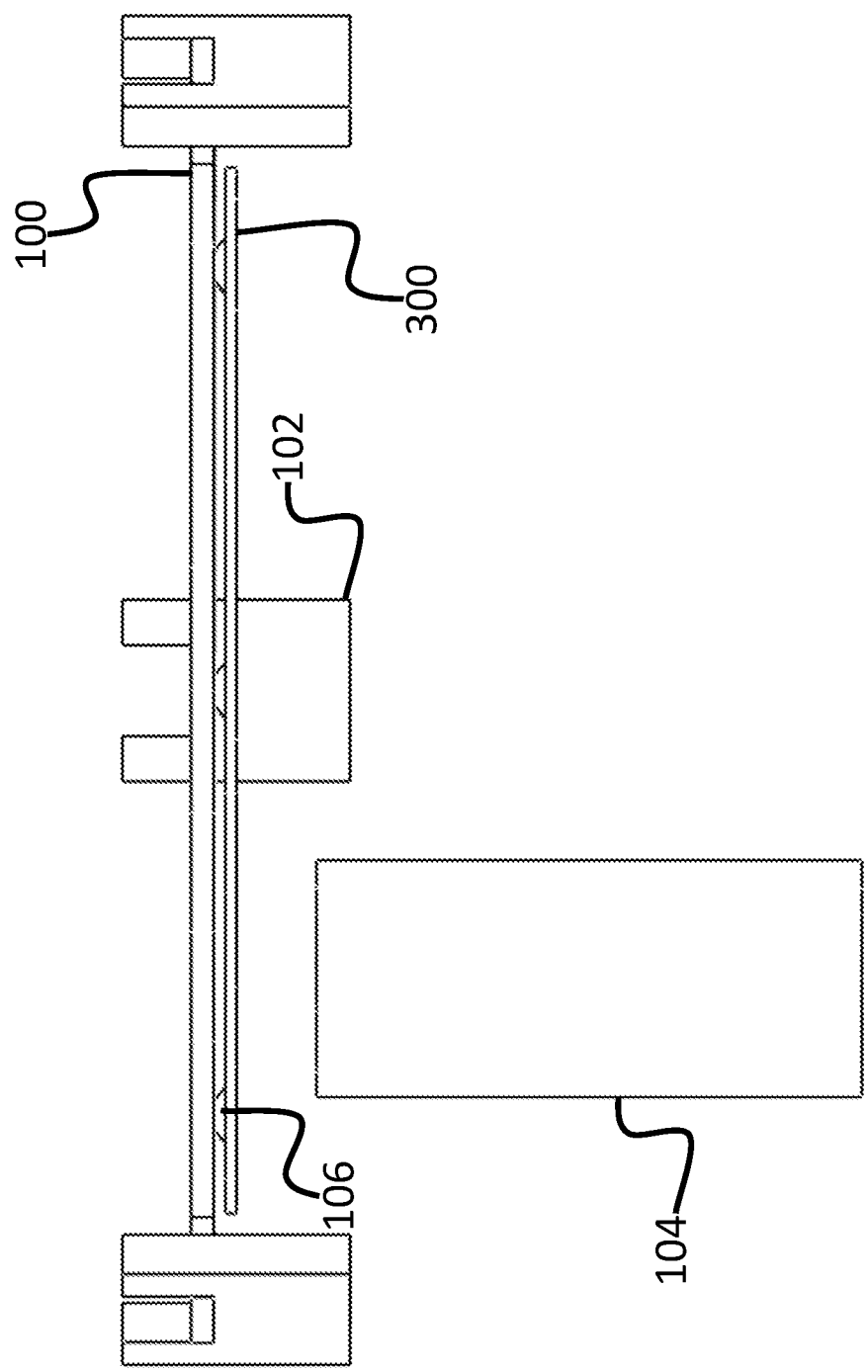
FIG. 5 is a side elevation view of a wafer lift and level assembly depicting a wafer attached to the wafer frame and further showing the levelling pedestal in a retracted or down position, in accordance with embodiments of the present disclosure.

Now referring to FIGS. 4 and 5, these Figures provide side elevation views of a wafer lift and level assembly depicting a wafer 300 attached to both a wafer frame 100 and the levelling pedestal 104, in accordance with embodiments of the present disclosure. More specifically, FIG. 4 shows the levelling pedestal 104 in a raised position wherein it is in contact with a wafer 300 whereas FIG. 5 shows the levelling pedestal 104 in a lowered position wherein it is not in contact with the wafer 300. While in this embodiment, the levelling pedestal 104 is described as being in a raised or lowered position, in embodiments the guide clevises 102 and/or levelling pedestal 104 are capable of vertical movement relative to one another.

Figure 6:
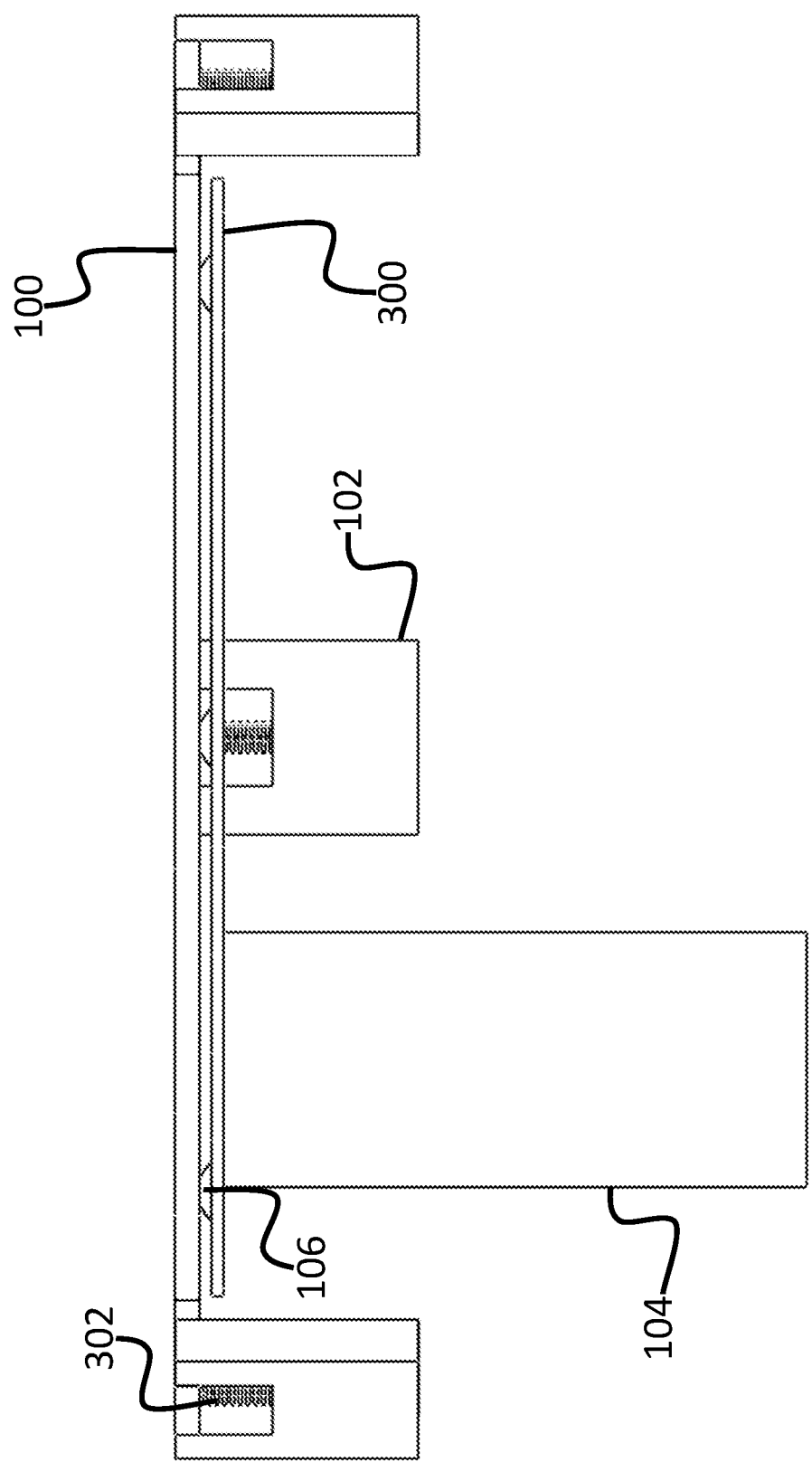
FIG. 6 is a side elevation view of a wafer lift and level assembly depicting a wafer attached to both a wafer frame and the levelling pedestal and further depicting counterbalances disposed in guide clevises, in accordance with embodiments of the present disclosure.

Now referring to FIG. 6, a side elevation view of an embodiment of the wafer lift and level assembly depicting a wafer 300 attached to both a wafer frame 100 and the levelling pedestal 104 is depicted. This embodiment further comprises dashpots 302 disposed in the guide clevises 102, which are shown in an extended configuration.

Figure 7:
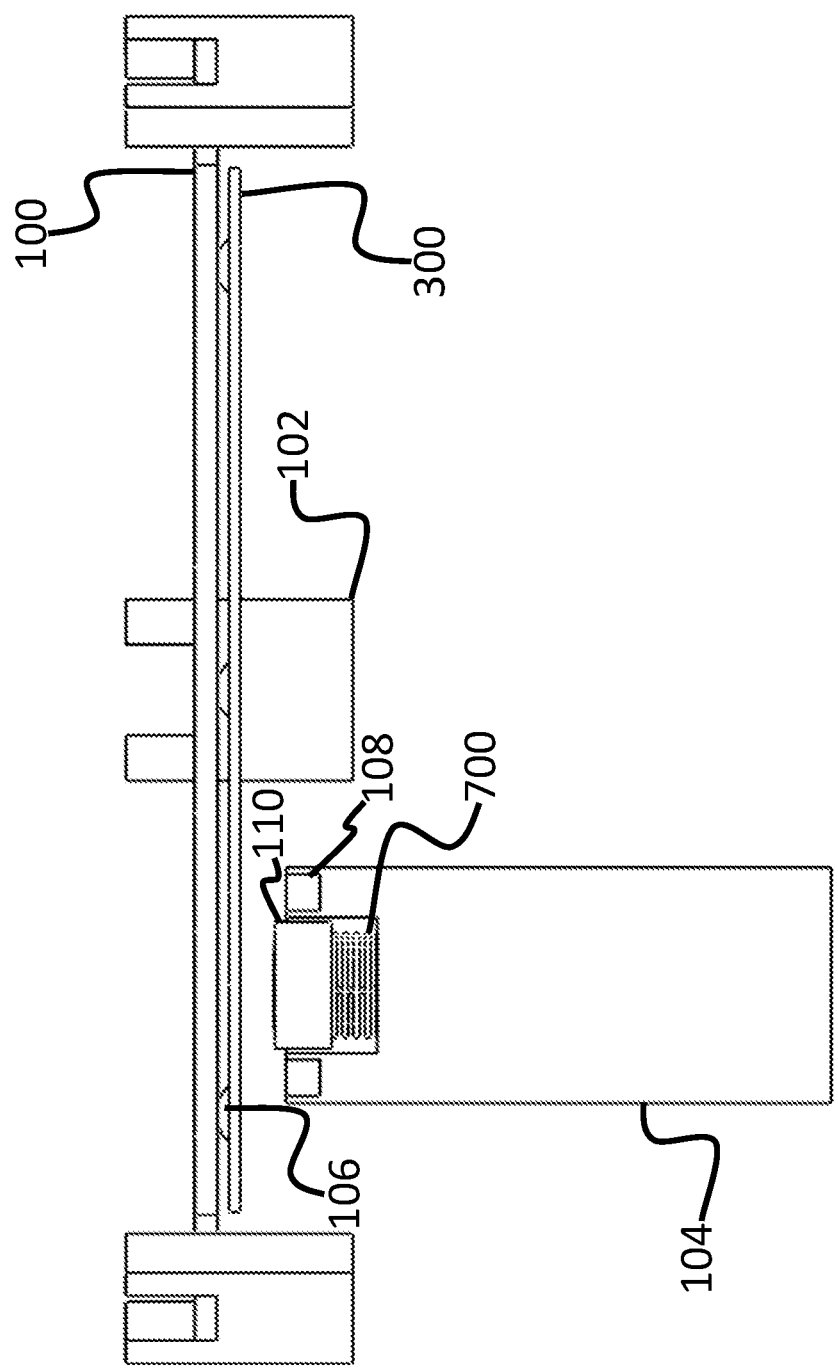
FIG. 7 is a side elevation view of a wafer lift and level assembly depicting a wafer attached to the wafer frame and further showing a section view of the levelling pedestal in a retracted or down position showing a levelling pedestal heater, biasing member configured to bias the levelling pedestal heater into a wafer, and vacuum ports disposed therein, in accordance with embodiments of the present disclosure.
Figure 8:
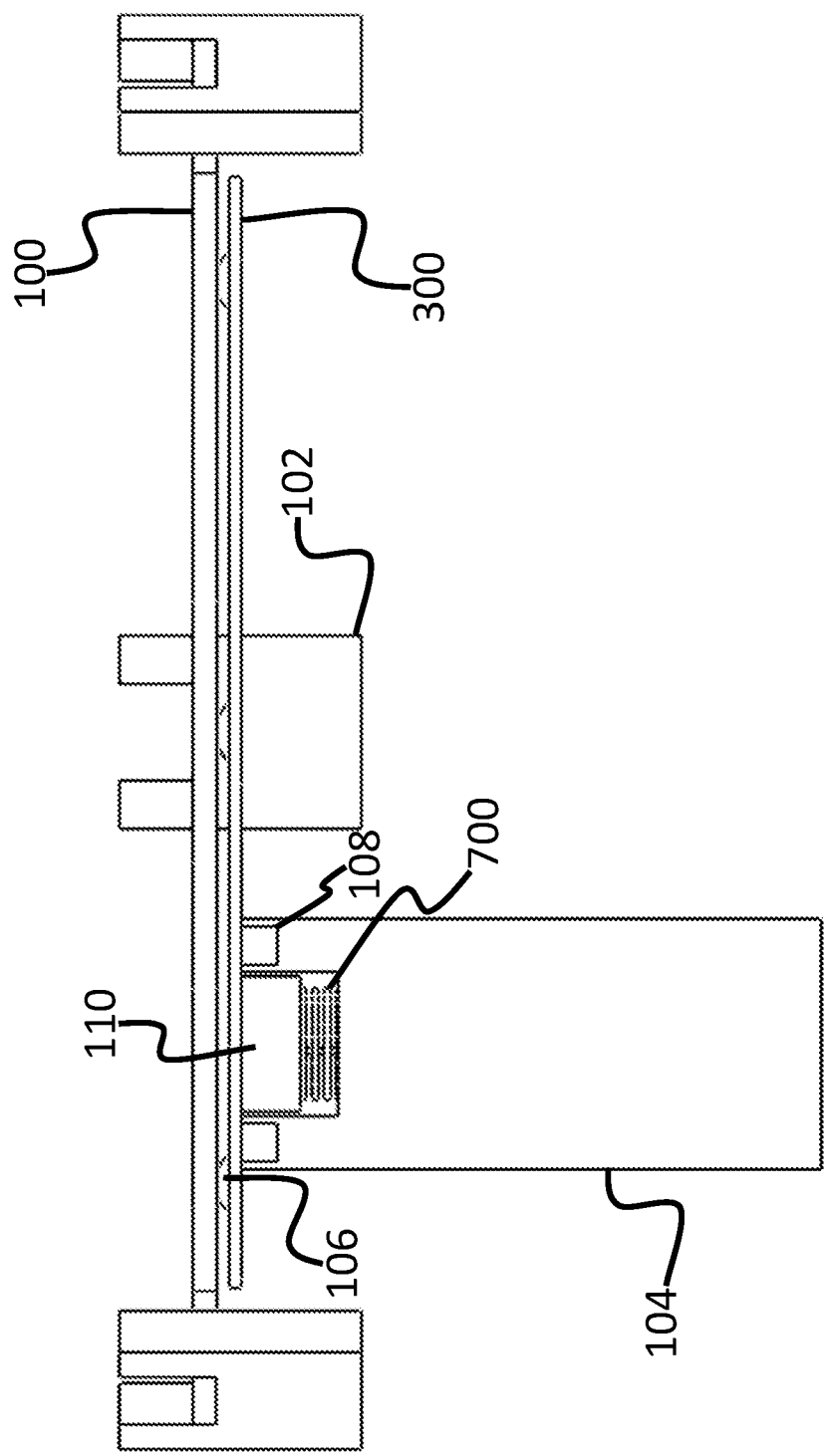
FIG. 8 is a side elevation view of a wafer lift and level assembly depicting a wafer attached to the wafer frame and levelling pedestal, which is depicted as a section view showing a levelling pedestal heater, biasing member configured to bias the levelling pedestal heater into a wafer, and vacuum ports disposed therein, in accordance with embodiments of the present disclosure.

Now referring to FIGS. 7 and 8, side elevation views of an embodiment of the wafer lift and level assembly depicting a wafer 300 attached to both a wafer frame 100 with the levelling pedestal 104 in a lowered position and a raised position, respectively, are depicted. This embodiment further comprises a heater dashpot 700 disposed in the levelling pedestal 104 that is configured to allow the heater 110, which is shown in an extended configuration, to be controllably raised and lowered and/or to have some compliance when being pressed against a wafer 300.

In embodiments, the heater dashpot 700 is a pneumatic dashpot. In still further embodiments, the heater dashpot 700 can be controllably raised and lowered, such as by a control module.

Although a dashpot is used in this embodiment, alternative embodiments utilize various means to allow the heater 100 to be controllably raised and lowered or to be compliant, such as electromechanical means, screw drives, solenoids, and the like, as would be known to one of ordinary skill in the art.

Figure 9:
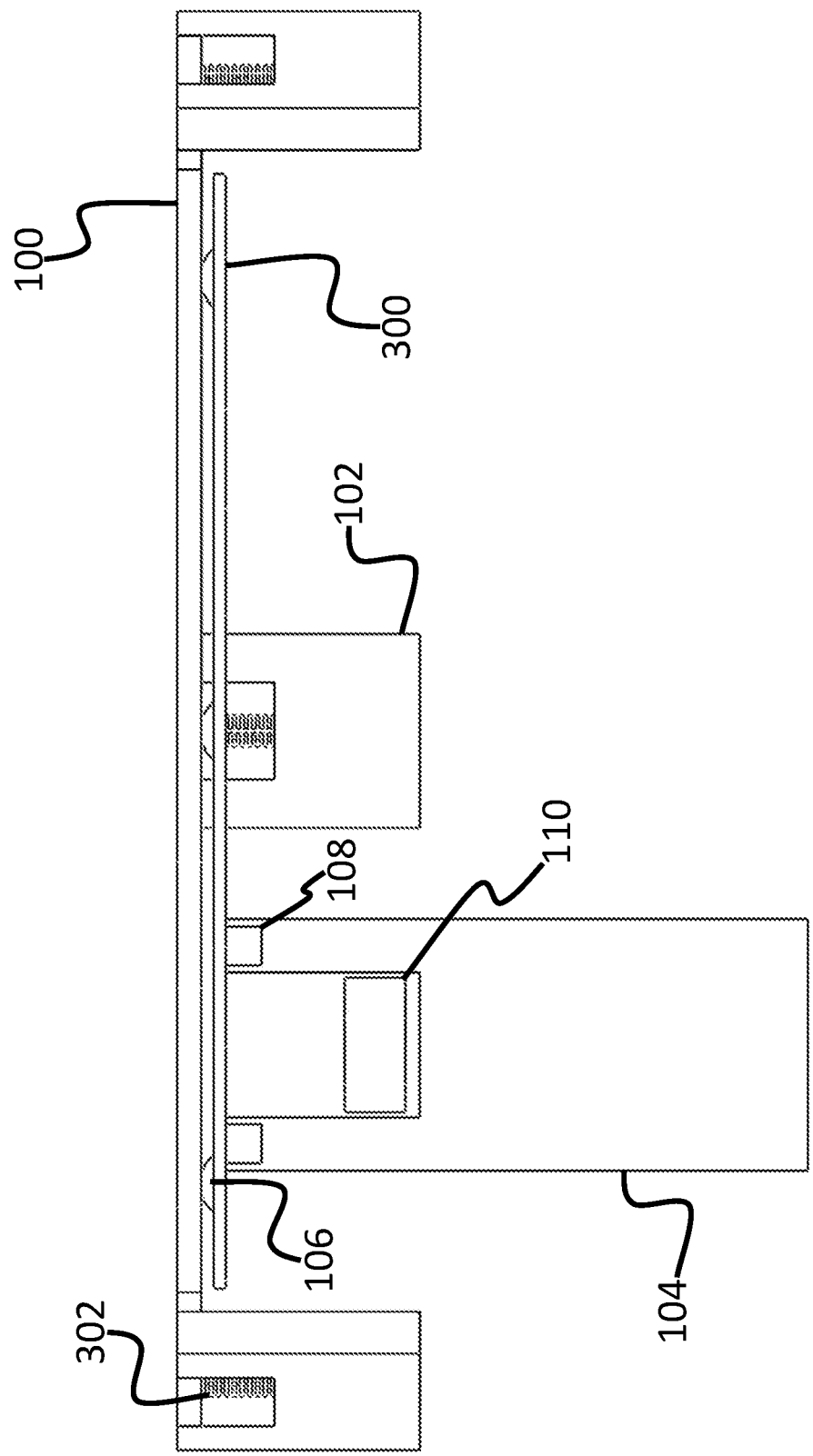
FIG. 9 is a side elevation view of a wafer lift and level assembly depicting a wafer attached to the wafer frame and levelling pedestal, which is depicted as a section view showing a levelling pedestal heater in a retracted or downward position as well as vacuum ports disposed therein, in accordance with embodiments of the present disclosure.
Figure 10:
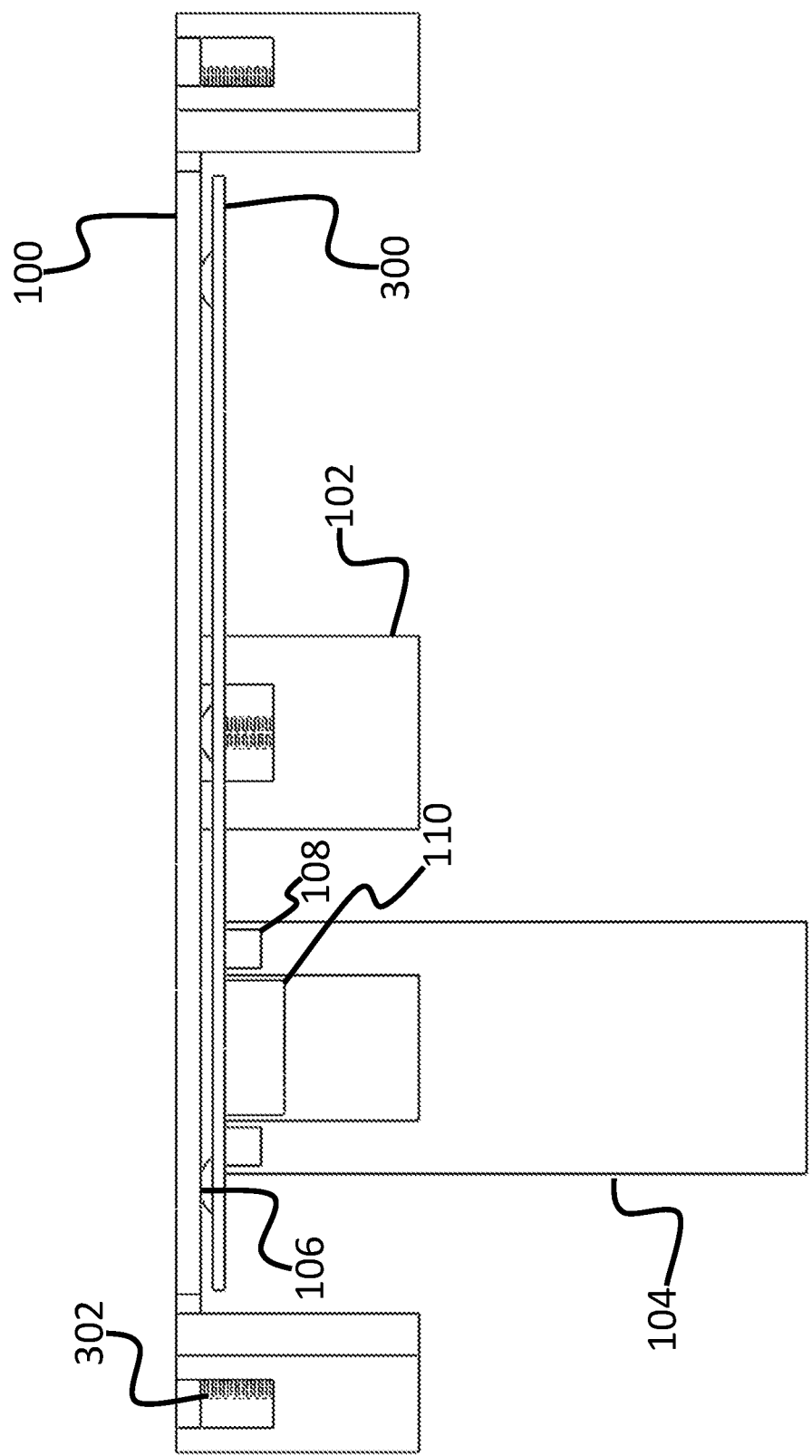
FIG. 10 is a side elevation view of a wafer lift and level assembly depicting a wafer attached to the wafer frame and levelling pedestal, which is depicted as a section view showing a levelling pedestal heater in an engaged or upper position as well as vacuum ports disposed therein, in accordance with embodiments of the present disclosure.

Now referring to FIGS. 9 and 10, these figures show side elevation views of an embodiment of the wafer lift and level assembly depicting a wafer 300 attached to both a wafer frame 100 and the levelling pedestal 104, with the levelling pedestal 104 shown as a section view. FIG. 9 shows the levelling pedestal heater 110 in a lowered position and FIG. 10 shows the levelling pedestal heater 110 in a raised position, abutting the wafer 300. This embodiment further comprises dashpots 302 disposed in the guide clevises 102, which are shown in an extended configuration. These figures also show the levelling pedestal wafer retainers 108 in contact with a wafer 300. In embodiments, the levelling pedestal wafer retainers 108 are configured to pull a vacuum against the wafer 300, thereby securing the wafer 300 and wafer frame 102 to the levelling pedestal 104.

The foregoing description of the embodiments of the disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

What is claimed is:

1. A wafer lift and level assembly comprising:
   a wafer frame;
   at least three guide clevises;
   a levelling pedestal comprising levelling pedestal wafer retainers disposed in a top portion of the levelling pedestal,
   wherein the wafer frame comprises tabs configured to be slidably retained in the guide clevises, allowing for vertical movement of the wafer frame therein, and wafer frame wafer retainers configured to securely hold a wafer thereto,
   wherein the levelling pedestal and guide clevises are configured for vertical motion relative to one another, allowing a wafer disposed in the wafer frame to be brought into contact with the levelling pedestal wafer retainers disposed in the top portion of the levelling pedestal,
   and wherein the levelling pedestal wafer retainers are configured to allow a wafer to be secured to the levelling pedestal.

2. The wafer lift and level assembly of claim 1 wherein the guide clevises comprise an open top portion, allowing the wafer frame to be inserted therein.

3. The wafer lift and level assembly of claim 1 wherein each of the guide clevises comprises at least one dashpot configured to be disposed between one of the tabs of the wafer frame and the guide clevis.

4. The wafer lift and level assembly of claim 3 wherein the dashpots are pneumatic dashpots.

5. The wafer lift and level assembly of claim 1 wherein the wafer frame wafer retainers are suction cups.

6. The wafer lift and level assembly of claim 1 wherein the wafer frame wafer retainers are vacuum ports in communication with a vacuum source.

7. The wafer lift and level assembly of claim 1 wherein the levelling pedestal further comprises a heater assembly.

8. The wafer lift and level assembly of claim 7 wherein the heater assembly further comprises an aperture.

9. The wafer lift and level assembly of claim 8 further comprising a focused energy source configured to heat a wafer held by the wafer frame when disposed in the guide clevises through the aperture disposed in the heater assembly.

10. The wafer lift and level assembly of claim 9 wherein the focused energy source is a laser.

11. The wafer lift and level assembly of claim 10 wherein the heater assembly is configured to be controllably raised and lowered within the levelling pedestal, thereby bringing it into and out of contact with a wafer disposed on the levelling pedestal.

12. A method of planarizing a wafer, the method comprising:
   providing a wafer lift and level assembly comprising:
      a wafer frame;
      at least three guide clevises;

a levelling pedestal comprising levelling pedestal wafer retainers disposed in a top portion of the levelling pedestal, wherein the wafer frame comprises tabs configured to be slidably retained in the guide clevises, allowing for vertical movement of the wafer frame therein, and wafer frame wafer retainers configured to securely hold a wafer thereto, wherein the levelling pedestal and guide clevises are configured for vertical motion relative to one another, allowing a wafer disposed in the wafer frame to be brought into contact with the levelling pedestal wafer retainers disposed in the top portion of the levelling pedestal, and wherein the levelling pedestal wafer retainers are configured to allow a wafer to be secured to the levelling pedestal attaching a wafer to the wafer frame;

disposing the wafer frame tabs in the guide clevises; and raising the levelling pedestal until a bottom portion of the wafer frame tabs ceases to contact a bottom portion of the guide clevises.

13. The method of claim 12 wherein the method further comprises activating the levelling pedestal wafer retainers once the levelling pedestal contacts the wafer.

14. The method of claim 12 wherein the levelling pedestal further comprises a heater, the method further comprising activating the heater during die bonding operations.

15. The method of claim 14 wherein the heater slidably disposed within the levelling pedestal, the method further comprising raising and lowering the heater during die bonding operations.

16. The method of claim 14 wherein the heater further comprises a central aperture and the levelling pedestal further comprises a focused energy source aimed through the central aperture, the method further comprising activating the focused energy source during a die bonding operation.

17. A wafer lift and level assembly comprising:

a wafer frame;

at least three guide clevises;

a levelling pedestal comprising levelling pedestal wafer retainers disposed in a top portion of the levelling pedestal, wherein the wafer frame comprises tabs configured to be slidably retained in the guide clevises, allowing for vertical movement of the wafer frame therein, and wafer frame wafer retainers configured to securely hold a wafer thereto, wherein the levelling pedestal and guide clevises are configured for vertical motion relative to one another, allowing a wafer disposed in the wafer frame to be brought into contact with the levelling pedestal wafer retainers disposed in the top portion of the levelling pedestal, wherein the levelling pedestal wafer retainers are configured to allow a wafer to be secured to the levelling pedestal, wherein the guide clevises comprise an open top portion, allowing the wafer frame to be inserted therein, wherein each of the guide clevises comprises at least one dashpot configured to be disposed between a tab of the wafer frame and the guide clevis, wherein the wafer frame wafer retainers are vacuum ports in communication with a vacuum source, wherein the levelling pedestal further comprises a heater assembly comprising an aperture and the levelling pedestal further comprises a focused energy source configured to heat a wafer held by the wafer frame when disposed in the guide clevises through the aperture disposed in the heater assembly, and wherein the heater assembly is configured to be controllably raised and lowered within the levelling pedestal, thereby bringing it into and out of contact with a wafer disposed on the levelling pedestal.

\* \* \* \* \*

UNITED STATES PATENT AND TRADEMARK OFFICE
CERTIFICATE OF CORRECTION

PATENT NO. : 11,791,197 B2
APPLICATION NO. : 17/782520
DATED : October 17, 2023
INVENTOR(S) : Nicholas Samuel Celia, Jr. and Cyriac Devasia Page 1 of 1

It is certified that error appears in the above-identified patent and that said Letters Patent is hereby corrected as shown below:

In the Claims

Column 8, Line 55 "devices" should read "clevises"

Signed and Sealed this
First Day of July, 2025

Coke Morgan Stewart
*Acting Director of the United States Patent and Trademark Office*